(12) United States Patent
Chang et al.

(10) Patent No.: US 12,708,030 B2
(45) Date of Patent: Aug. 11, 2026

(54) METHOD OF FILLING GAPS BETWEEN DIES USING SILICON DIOXIDE

(71) Applicant: TAIWAN SEMICONDUCTOR MANUFACTURING COMPANY, LTD., Hsinchu (TW)

(72) Inventors: Chih-Hang Chang, Hsinchu (TW); Kuang-Wei Cheng, Hsinchu (TW); Ku-Feng Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 490 days.

(21) Appl. No.: 18/137,973

(22) Filed: Apr. 21, 2023

(65) Prior Publication Data

US 2024/0355696 A1 Oct. 24, 2024

(51) Int. Cl.

| | |
|---|---|
| ***H01L 23/31*** | (2006.01) |
| ***H01L 23/29*** | (2006.01) |
| ***H01L 23/538*** | (2006.01) |
| ***H10W 70/05*** | (2026.01) |
| ***H10W 70/60*** | (2026.01) |
| ***H10W 70/63*** | (2026.01) |
| ***H10W 74/10*** | (2026.01) |
| ***H10W 74/43*** | (2026.01) |
| ***H10W 76/05*** | (2026.01) |
| *H10W 74/40* | (2026.01) |
| *H10W 90/00* | (2026.01) |

(52) U.S. Cl.

CPC ....... *H10W 74/147* (2026.01); *H10W 70/093* (2026.01); *H10W 70/095* (2026.01); *H10W 70/611* (2026.01); *H10W 70/635* (2026.01); *H10W 74/141* (2026.01); *H10W 74/43* (2026.01); *H10W 76/05* (2026.01); *H10W 74/40* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 5,070,036 | A | 12/1991 | Stevens | |
| 8,916,480 | B2 | 12/2014 | Kuo et al. | |
| 10,020,286 | B2 | 7/2018 | Chen et al. | |
| 10,147,747 | B2 * | 12/2018 | Toriumi | H10D 64/62 |
| 10,510,674 | B2 | 12/2019 | Lin et al. | |
| 11,239,225 | B2 | 2/2022 | Chen et al. | |
| 11,417,580 | B2 | 8/2022 | Yu et al. | |
| 2013/0049216 | A1 | 2/2013 | Lin et al. | |

(Continued)

FOREIGN PATENT DOCUMENTS

| | | |
|---|---|---|
| TW | I705546 B | 9/2020 |

*Primary Examiner* — Lawrence C Tynes, Jr.
(74) *Attorney, Agent, or Firm* — STUDEBAKER BRACKETT PLLC

(57) ABSTRACT

A method of forming an IC structure includes bonding a first die to a first side of a substrate and bonding a second die to the first side of the substrate. The second die is adjacent to the first die and a gap is defined between the first and second dies. The method includes forming a first dielectric layer (DL) over the first and second dies and in the gap, forming a first opening in the first DL in the gap, forming a second DL over the first DL and in the first opening. The first DL includes a higher film stress in absolute value than the second DL.

20 Claims, 16 Drawing Sheets

(56) References Cited

U.S. PATENT DOCUMENTS

| | | | |
|---|---|---|---|
| 2013/0174982 | A1 | 7/2013 | Lin et al. |
| 2018/0114946 | A1 | 4/2018 | Chen et al. |
| 2018/0233466 | A1 | 8/2018 | Yen et al. |
| 2021/0125885 | A1* | 4/2021 | Chen .................. H10W 74/117 |
| 2021/0407947 | A1 | 12/2021 | Chen et al. |
| 2023/0369070 | A1* | 11/2023 | Ho ........................ H01L 21/561 |

* cited by examiner 66
66
64
62
60

68
68
68
66
66
66
66
64
64
60
60

70
72
76
79
78
91
77
106
94
17
74
66
60
68
90
64
117
92
118
116
96
104

METHOD OF FILLING GAPS BETWEEN DIES USING SILICON DIOXIDE

BACKGROUND

Since the invention of the integrated circuit, the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

An additional limit comes from the significant increase in the number and the length of interconnections between devices as the number of devices increases. When the number and length of interconnections increase, both circuit RC delay and power consumption (heat) increase. Three-dimensional (3D) integrated circuits (ICs) are therefore created to resolve the above-discussed limitations.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figures 1, 2:
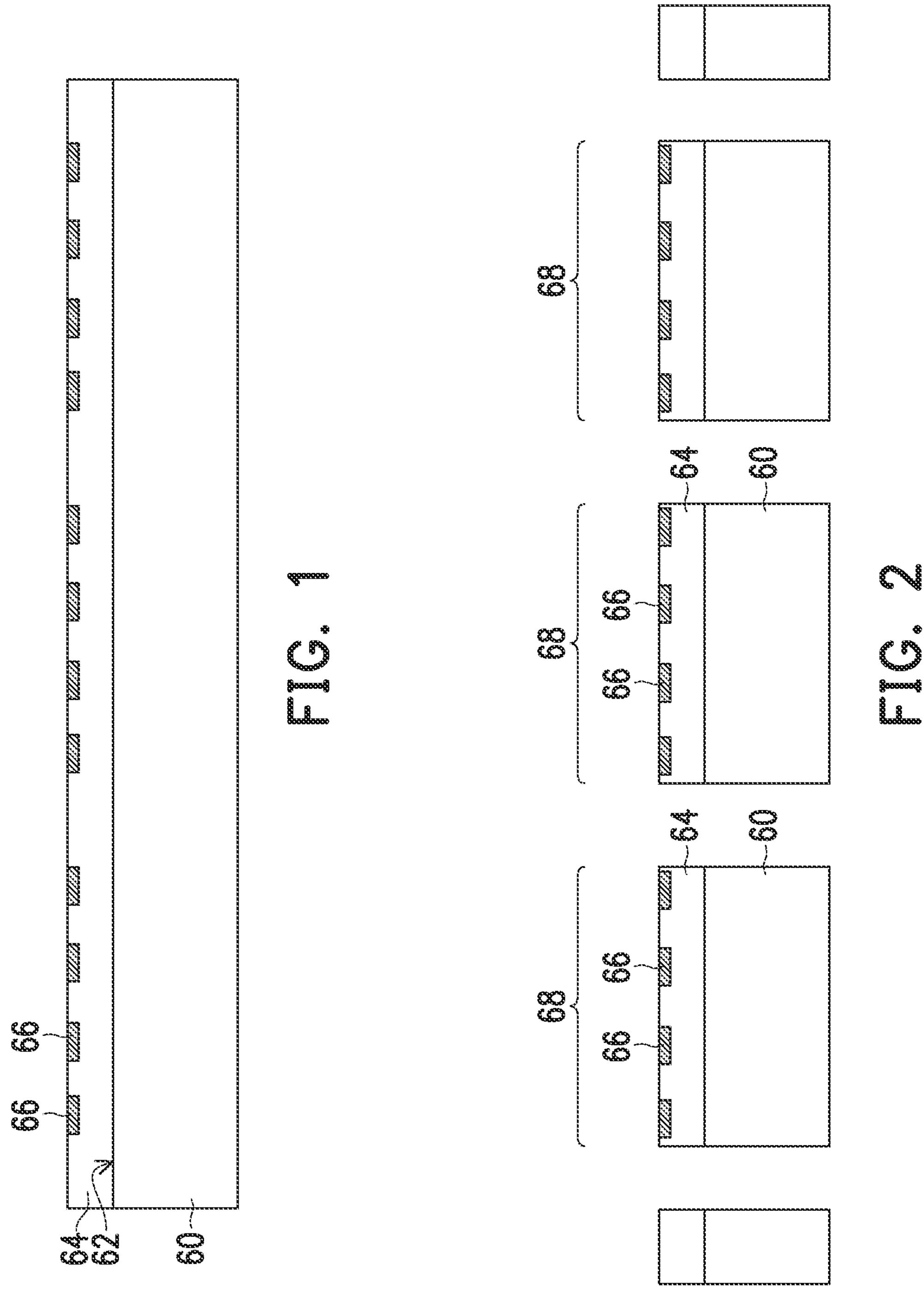
FIG. 1 illustrates the formation of one or more active dies included in a substrate.
FIG. 2 illustrates the substrate in FIG. 1 including an interconnect structure singulated into individual dies.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Three-dimensional integrated circuits (3D-ICs) offer many solutions to reducing physical sizes of packaged components and allowing for a greater number of components to be placed in a given chip area. One solution that 3D-IC components offer is to stack dies on top of one another and interconnect or route them through connections such as through-silicon vias (TSVs). Some of the benefits of 3D-IC, for example, include exhibiting a smaller footprint, reducing power consumption by reducing the lengths of signal interconnects, and improving yield and fabrication cost if individual dies are tested separately prior to assembly. Methods for forming 3D IC also include die-to-wafer bonding, wherein a plurality of dies are bonded to a wafer. An advantageous feature of the die-to-wafer bonding is that the size of dies may be smaller than the size of chips on the wafer. During a typical die-to-wafer bonding process, spacings will be left between the dies.

FIG. 1 illustrates the formation of one or more dies 68 included in a substrate 60. The dies 68 may also be referred to as active dies as opposed to dummy dies discussed below. The substrate 60 is a wafer and may include a bulk semiconductor substrate, semiconductor-on-insulator (SOI) substrate, multi-layered semiconductor substrate, or the like. The semiconductor material of the substrate 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 60 may be doped or undoped. Devices, such as transistors, capacitors, resistors, diodes, and the like, may be formed in and/or on an active surface 62 of the substrate 60.

An interconnect structure 64 including one or more dielectric layers and metallization patterns is formed on the active surface 62. The metallization patterns in the dielectric layers may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 66, such as conductive pillars (for example, including a metal such as copper), are formed in and/or on the interconnect structure 64 to provide an external electrical connection to the circuitry and devices. In some embodiments, the die connectors 66 protrude from the interconnect structure 64 to form pillar structure to be utilized when bonding the dies 68 to other structures.

In an example, an inter-metallization dielectric (IMD) layer may be formed in the interconnect structure 64. The IMD layer may be formed, for example, of a low-K dielectric material, such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable methods, such as spinning, chemical vapor deposition (CVD), plasma-enhanced CVD (PECVD), high-density plasma chemical vapor deposition (HDP-CVD), or the like.

In FIG. 2, the substrate 60 including the interconnect structure 64 is singulated into individual dies 68. Typically, each singulated die 68 contains the same circuitry, such as devices and metallization patterns, although the dies may have different circuitry. The singulation may be by sawing, dicing, or the like.

The dies 68 may be logic dies (e.g., central processing unit, graphics processing unit, system-on-a-chip, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 68 may be different sizes (e.g., different heights and/or surface areas), and in other embodiments, the dies 68 may be the same size (e.g., same heights and/or surface areas).

Figure 3:
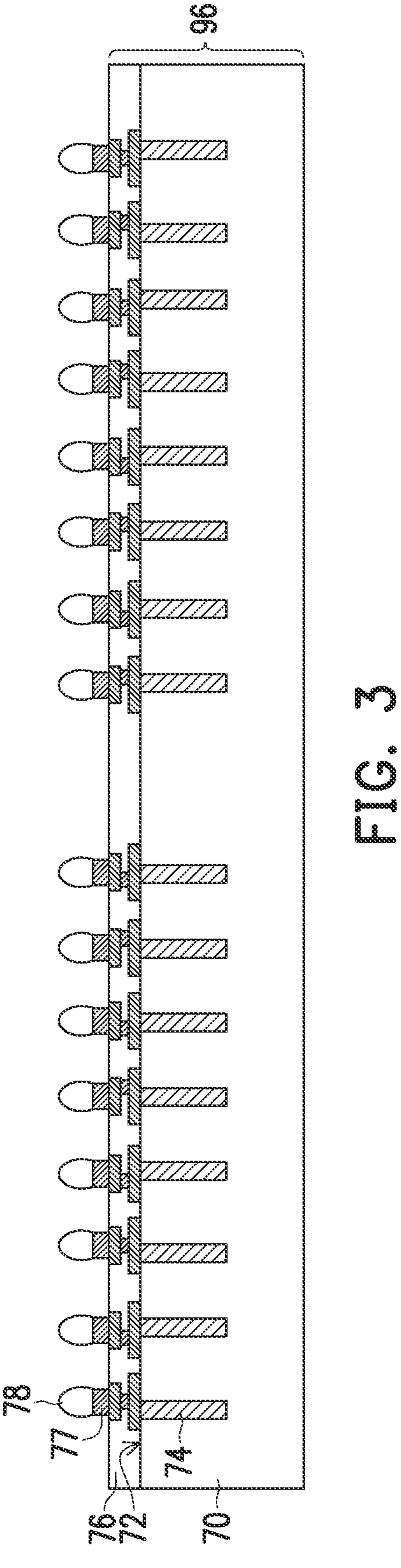
FIG. 3 illustrates the formation of a first side of one or more components.

FIG. 3 illustrates the formation of a first side of one or more components 96. As illustrated in FIG. 3, the one or more components 96 may be formed from the substrate 70. The components 96 may be an interposer or another die. The substrate 70 can be a wafer. The substrate 70 may comprise a bulk semiconductor substrate, SOI substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 70 may be doped or undoped. Devices, such as transistors, capacitors, resistors, diodes, and the like, may be formed in and/or on a first surface 72, which may also be referred to as an active surface, of the substrate 70.

Through-vias (TVs) 74 are formed to extend from the first surface 72 of substrate 70 into substrate 70. The TVs 74 are also sometimes referred to as through-substrate vias or through-silicon vias when substrate 70 is a silicon substrate. The TVs 74 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings, such as by CVD, ALD, PVD, thermal oxidation, a combination thereof, and/or the like. A conductive material may be deposited over the thin barrier layer and in the openings. The conductive material may be formed by an electro-chemical plating process, CVD, ALD, PVD, a combination thereof, and/or the like. The TVs 74 may include comprise a conductive material and a thin barrier layer between the conductive material and the substrate 70. The barrier layer may include a nitride or an oxynitride, such as titanium nitride, titanium oxynitride, tantalum nitride, tantalum oxynitride, tungsten nitride, a combination thereof, and/or the like. Examples of conductive materials are copper, tungsten, aluminum, silver, gold, a combination thereof, and/or the like.

Redistribution structure 76 is formed over the first surface 72 of the substrate 70, and is used to electrically connect the integrated circuit devices, if any, and/or TVs 74 together and/or to external devices. The redistribution structure 76 may include one or more dielectric layer(s) and respective metallization pattern(s) in the dielectric layer(s). The metallization patterns may comprise vias and/or traces to interconnect any devices and/or TVs 74 together and/or to an external device. The metallization patterns are sometimes referred to as Redistribution Lines (RDL). The dielectric layers may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVD, or the like. Any excessive diffusion barrier layer and/or conductive material on the dielectric layer may be removed, such as by using a CMP.

Electrical connectors 77/78 are formed at the top surface of the redistribution structure 76 on conductive pads. In some embodiments, the conductive pads include under bump metallurgies (UBMs). In the illustrated embodiment, the pads are formed in openings of the dielectric layers of the redistribution structure 76. In another embodiment, the pads (UBMs) can extend through an opening of a dielectric layer of the redistribution structure 76 and also extend across the top surface of the redistribution structure 76. As an example to form the pads, a seed layer (not shown) is formed at least in the opening in the dielectric layer of the redistribution structure 76. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

In some embodiments, the electrical connectors 77/78 include a metal pillar 77 with a metal cap layer 78, which may be a solder cap 78, over the metal pillar 77. The electrical connectors 77/78 including the pillar 77 and the cap layer 78 are sometimes referred to as micro bumps 77/78. In some embodiments, the metal pillars 77 include a conductive material such as copper, aluminum, gold, nickel, palladium, the like, or a combination thereof and may be formed by sputtering, printing, electro plating, electroless plating, CVD, or the like. The metal pillars 77 may be solder free and have substantially vertical sidewalls. In some embodiments, a metal cap layer 78 is formed on the top of the metal pillar 77. The metal cap layer 78 may include nickel, tin, tin-lead, gold, copper, silver, palladium, indium, nickel-palladium-gold, nickel-gold, the like, or a combination thereof and may be formed by a plating process.

In another embodiment, the electrical connectors 77/78 are solder balls and/or bumps, such as controlled collapse chip connection (C4), electroless nickel immersion gold (ENIG), electroless nickel electroless palladium immersion gold technique (ENEPIG) formed bumps, or the like. In this embodiment, the bump electrical connectors 77/78 may include a conductive material such as solder, copper, aluminum, gold, nickel, silver, palladium, tin, the like, or a combination thereof. In this embodiment, the electrical connectors 77/78 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 4:
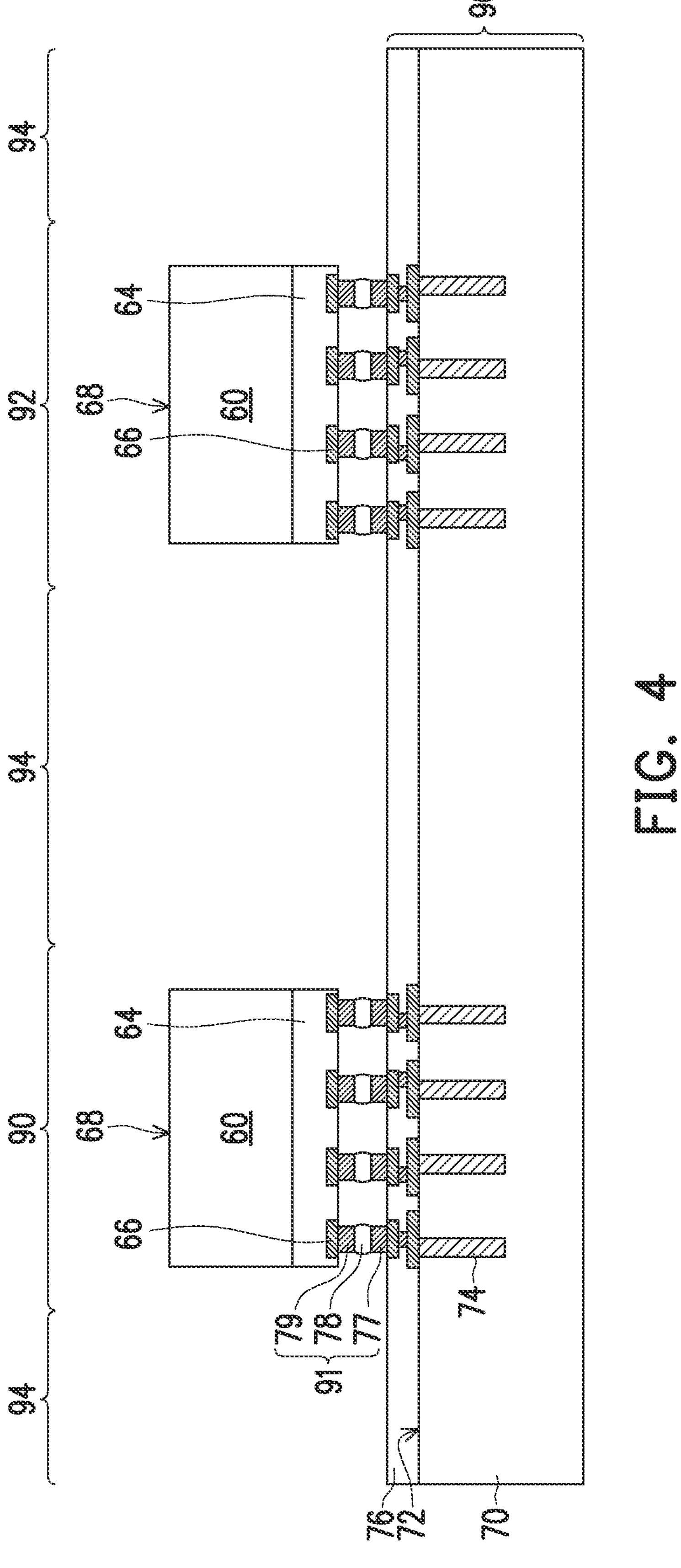
FIG. 4 illustrates active dies attached to the first side of the components.

In FIG. 4, the dies 68 are attached to the first side of the components 96, for example, through flip-chip bonding by way of the electrical connectors 77/78 and the metal pillars 79 on the dies to form conductive joints 91. The metal pillars 79 may be similar to the metal pillars 77. The dies 68 may be placed on the electrical connectors 77/78 using, for example, a pick-and-place tool. In some embodiments, the metal cap layers 78 are formed on the metal pillars 77 (as shown in FIG. 3), the metal pillars 79 of the dies 68.

In the embodiments, wherein the die connectors 66 protrude from the interconnect structures 64, the metal pillars 79 may be excluded from the dies 68 as the protruding die connectors 66 may be used as the pillars for the metal cap layers 78.

The conductive joints 91 electrically couple the circuits in the dies 68 through interconnect structures 64 and die connectors 66, respectively, to redistribution structure 76 and TVs 74 in components 96.

In some embodiments, before bonding the electrical connectors 77/78, the electrical connectors 77/78 are coated with a flux (not shown), such as a no-clean flux. The electrical connectors 77/78 may be dipped in the flux or the flux may be jetted onto the electrical connectors 77/78.

The bonding between the dies 68 and the components 96 may be a solder bonding or a direct metal-to-metal (such as a copper-to-copper or tin-to-tin) bonding. In an embodiment, the dies 68 are bonded to the components 96 by a reflow process. During this reflow process, the electrical connectors 77/78/79 are in contact with the die connectors 66, respectively, and the pads of the redistribution structure 76 to physically and electrically couple the dies 68 to the components 96. After the bonding process, an intermetallic compound (IMC) may form at the interface of the metal pillars 77 and 79 and the metal cap layers 78.

In FIG. 4 and subsequent figures, a first package region 90 and a second package region 92 for the formation of a first package and a second package, respectively, are illustrated. Scribe line regions 94 are between adjacent package regions. As illustrated in FIG. 4, a die 68 is attached in each of the first package region 90 and the second package region 92.

In some embodiments, the dies 68 are system-on-a-chip (SoC) or a graphics processing unit (GPU) and the second dies are memory dies that may utilized by the dies 68.

Figure 5:
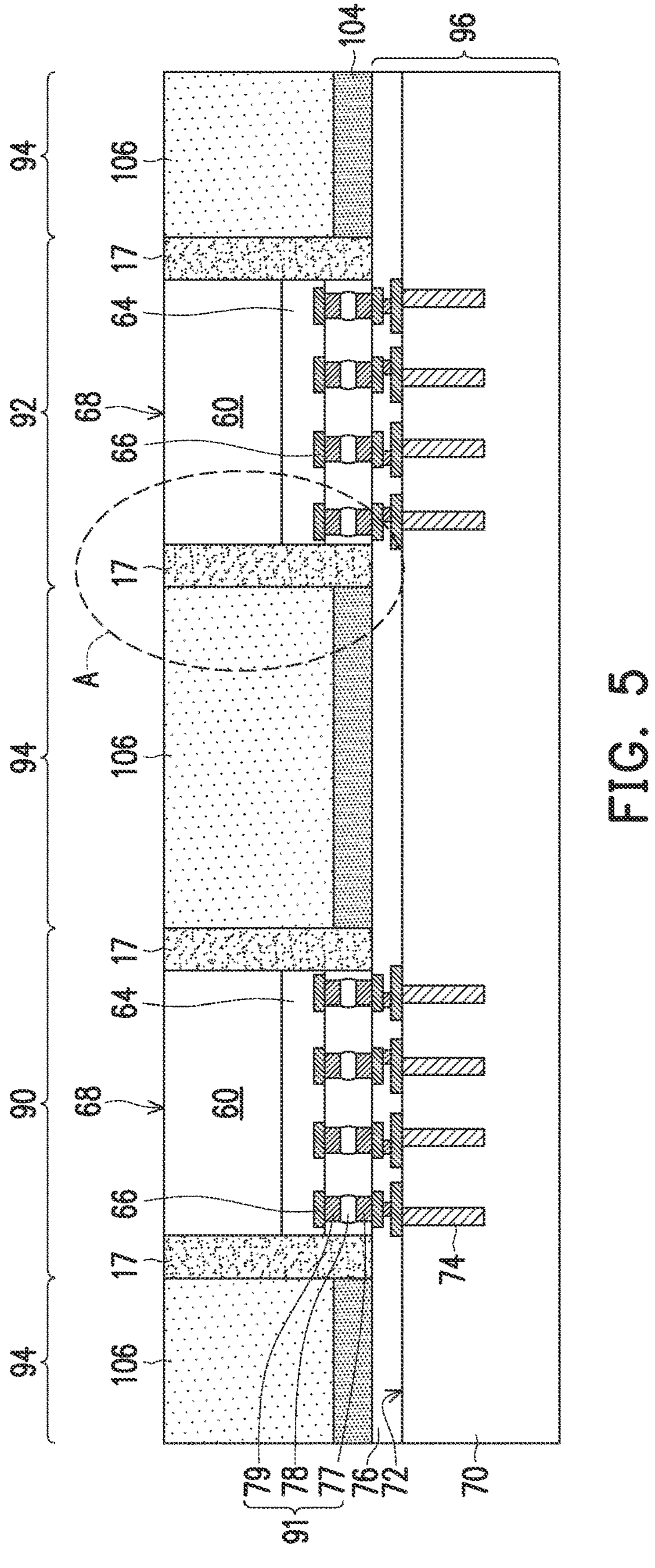
FIG. 5 illustrates dummy dies adhered in scribe line regions with an attaching structure.

In FIG. 5, dummy dies 106 are adhered in the scribe line regions 94 with an attaching structure 104.

The dummy dies 106 are attached to the components 96 with the attaching structure 104. In some embodiments, the attaching structure 104 is an adhesive that adheres the dummy dies 106 to the components 96. In some other embodiments, the attaching structure is one or more micro bumps that bond the dummy dies 106 to the components 96. The dummy dies 106 may be made of silicon, a dielectric material, the like, or a combination thereof. In some embodiments, the dummy dies 106 are actually defective active dies that have been recycled as dummy dies 106. In some embodiments, the dummy dies 106 are bulk material and do not include any active or passive devices. In some embodiments, the top surfaces of the dummy dies 106 are level with the back sides of the dies 68. In some embodiments, no electrical connection between the dummy dies and the components 96 and the active dies 106 is provided.

As illustrated in FIG. 5, the adhesive attaching structure 104 is on bottom surfaces of the dummy dies 106 and adheres the dummy dies 106 to the components 96, such as the redistribution structure 76. The adhesive 104 may be any suitable adhesive, epoxy, die attach film (DAF), or the like. The adhesive 104 may be applied to a bottom surface of the dummy dies 106 or may be applied over the surface of the redistribution structure 76. The dummy dies 106 may be adhered to the redistribution structure 76 by the adhesive 104 using, for example, a pick-and-place tool.

Figure 6:
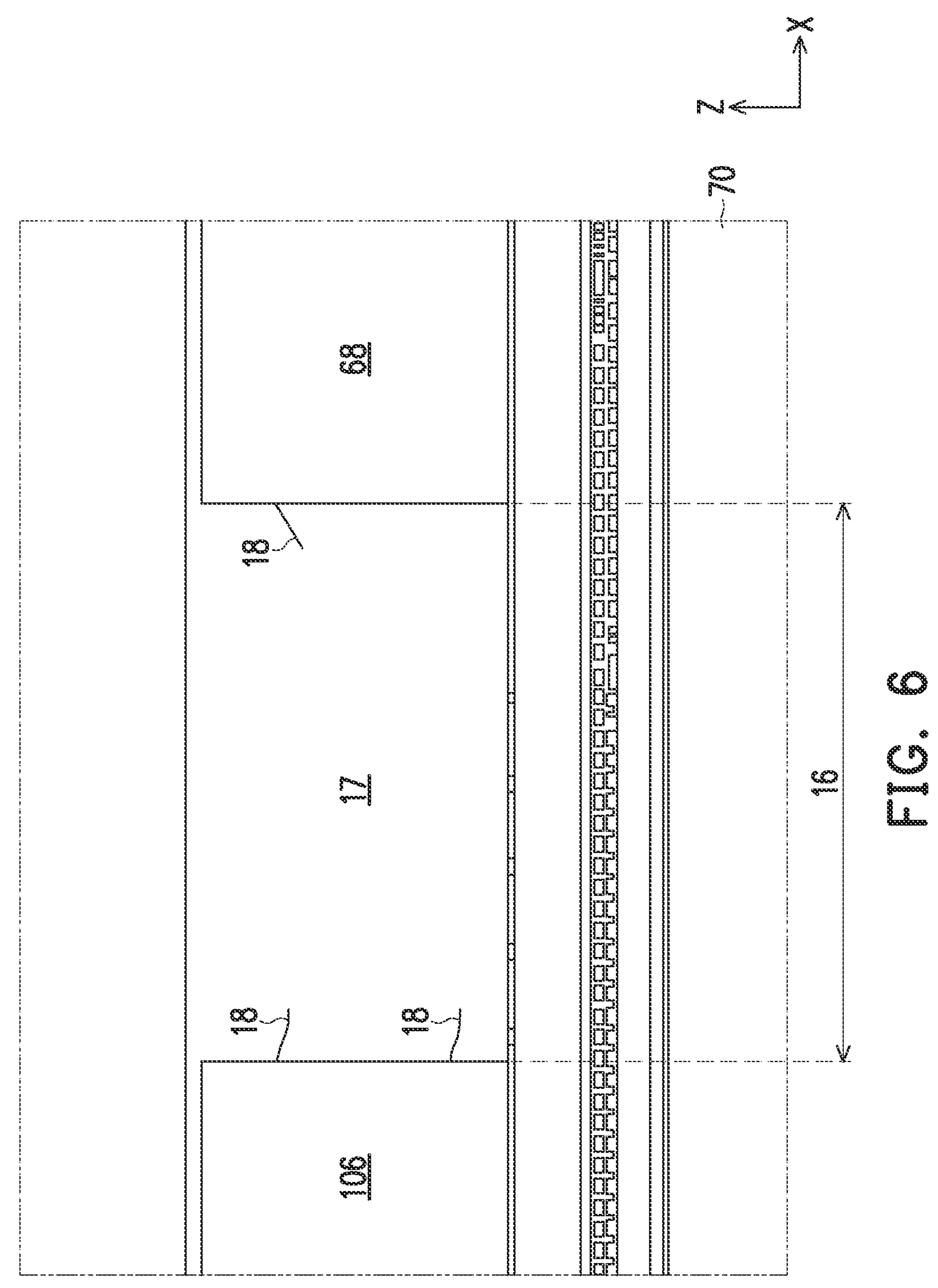
FIG. 6 illustrates area A encircled in FIG. 5 depicting the spacings or gaps left between the dies and the dummy dies.

FIG. 6 illustrates the area A encircled in FIG. 5 depicting the spacings or gaps left between the active dies 68 and the dummy dies 106. These gaps are covered with silicon dioxide 17 composed of multiple layers that fill the gaps. The layers of silicon dioxide may be coated using spin on coating, while ensuring that the silicon dioxide is not coated onto the dies by using a mask to screen the dies. After the coating of the layer of silicon dioxide, a baking is performed to solidify the layers of silicon dioxide. Alternatively, the layers of silicon dioxide may be molded on the dies, for example, using compression molding. A curing step may be performed to cure the layers, wherein the curing may be a thermal curing, a UV curing, the like, or a combination thereof. The dies and the layers of silicon dioxide are then polished, for example, using chemical mechanical polish (CMP).

The multiple layers of silicon dioxide all have similar characteristics, e.g., thickness, and thus each layer exerts a similar compressive stress. The resulting compressive stress due to the layers of silicon dioxide results in wafer warpage that causes errors in wafer fabrication. Reducing the number of layers can reduce the compressive stress, but the silicon dioxide is prone to cracking, for instance, after a planarization (polishing) operation because of having a relatively lower Young's modulus. FIG. 6 illustrates the die 68, also referred to as a top die 68 adjacent the dummy die 106. The die 68 and the dummy die 106 leave spacings 16 therebetween. Relatively thick silicon dioxide 17 formed by multiple layers of silicon dioxide is formed in the spacings 16. As discussed above, the relatively thick silicon dioxide 17 is prone to cracking. As illustrated, cracks 18 are formed in the layers of the silicon dioxide 17.

Embodiments of the disclosure are directed to reducing the cracking of the silicon dioxide deposited between the dies and limiting wafer warpage. According to embodiments, the cracks can be reduced and wafer warpage can be reduced by forming multiple layers of the silicon dioxide between the dies, wherein the multiple layers of the silicon dioxide include one or more layers of silicon dioxide that are thicker than the other layers of silicon dioxide in the spacing. In embodiments, the bottommost layer of silicon dioxide is made thicker than the other layers of silicon dioxide in the spacing. A thicker bottommost layer of silicon dioxide exhibits higher stress (e.g., compressive stress) relative to the layers of silicon dioxide above the bottommost layer. The higher stress bottommost silicon dioxide layer is resistant to cracking and the lower stress upper layers of silicon dioxide minimize warpage during wafer processing operations.

In some embodiments, the multiple layers of the silicon dioxide include one or more layers of the silicon dioxide having a higher density than the other layers of silicon dioxide in the spacing. In embodiments, the bottommost layer of silicon dioxide has a higher density than the other layers of silicon dioxide in the spacing. In embodiments, the multiple layers of the silicon dioxide include one or more layers of the silicon dioxide having a higher refractive index (RI) than the other layers of silicon dioxide in the spacing. In embodiments, the bottommost layer of silicon dioxide has a higher refractive index than the other layers of silicon dioxide in the spacing. In some embodiments, the bottommost layer of silicon dioxide is the thickest, has the highest density, and/or the highest refractive index (RI) compared to the other layers of silicon dioxide in the spacing.

According to embodiments, the multiple layers of silicon dioxide are deposited using chemical vapor deposition (CVD) processes.

Although embodiments of the disclosure are discussed with reference to filling gaps between dummy dies and active dies, the discussion is an example. Embodiments are not limited to filling gaps only between dummy dies and active dies, and the teachings of the disclosure can be equally applied to filling gaps between any two components, without departing from the scope of the disclosure.

Figure 7A:
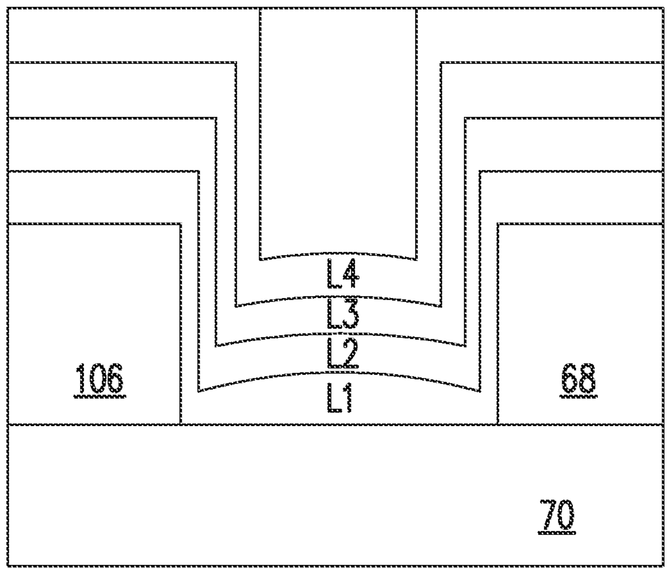
FIG. 7A illustrates multiple layers of silicon dioxide deposited between the active die and the dummy die stacked on the substrate.

FIG. 7A illustrates multiple layers L1, L2, L3, and L4 of silicon dioxide deposited between the die 68 and the dummy die 106 stacked on the substrate 70. Each layer L1, L2, L3, and L4 of silicon dioxide has similar thickness and composition. Thus, each layer L1, L2, L3, and L4 of silicon dioxide exerts a uniform stress, e.g., compressive stress, and cracking is observed in the silicon dioxide layers, as discussed above.

Figure 7B:
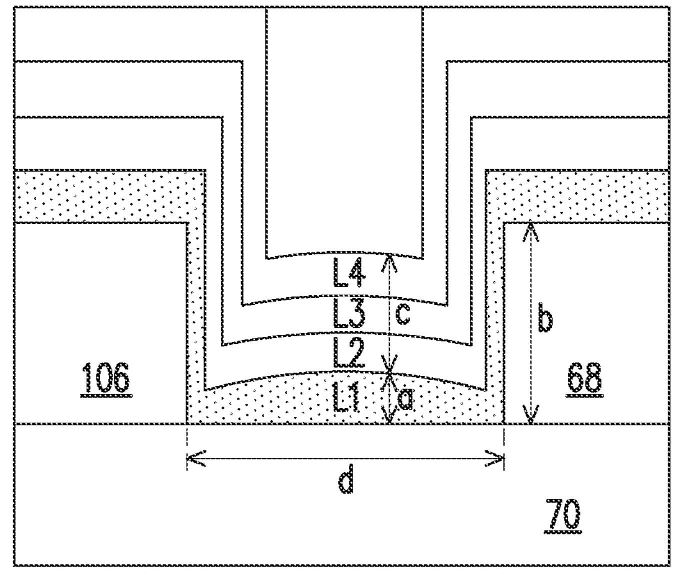
FIG. 7B illustrates multiple layers of silicon dioxide deposited in the gap between the active die and the dummy die, according to embodiments of the disclosure.

FIG. 7B illustrates multiple layers L1, L2, L3, and L4 of silicon dioxide deposited in the gap between the die 68 and the dummy die, according to embodiments of the disclosure. The bottommost layer L1 of silicon dioxide is made thicker (Z-direction in FIG. 7B) than the other layers L2, L3, and L4 of silicon dioxide. The thicker bottommost layer L1 of silicon dioxide exerts a compressive stress between −20 MPa to −120 MPa. The compressive stress exerted collectively by the layers L2, L3, and L4 of silicon dioxide is between 0 to −50 MPa.

Referring to FIG. 7B, in some embodiments, the ratio of a thickness (a) of the bottommost layer L1 of silicon dioxide to a thickness or height (b) of the top die 202 is 0.01 to 0.4. In some embodiment, a sum of the thickness (a) of the bottommost layer L1 of silicon dioxide and the thickness or height (b) of the top die 202 is 15 μm or higher. In some embodiments, the thickness or height (b) of the top die 202 is 15 μm to 35 μm. Referring to FIG. 7B, in some embodiments, a width (d) of the spacing between the top dies 202 is at least 40 μm.

As illustrated in FIG. 7B, upper surfaces of the layers L1, L2, L3, and L4 of silicon dioxide may include a protrusion sloping upward. The upper surfaces may have a profile that includes a first curvature and a first center thickness. The thickness (a) is generally measured at or adjacent the first center thickness of the layers L1, L2, L3, and L4.

Figure 8A:
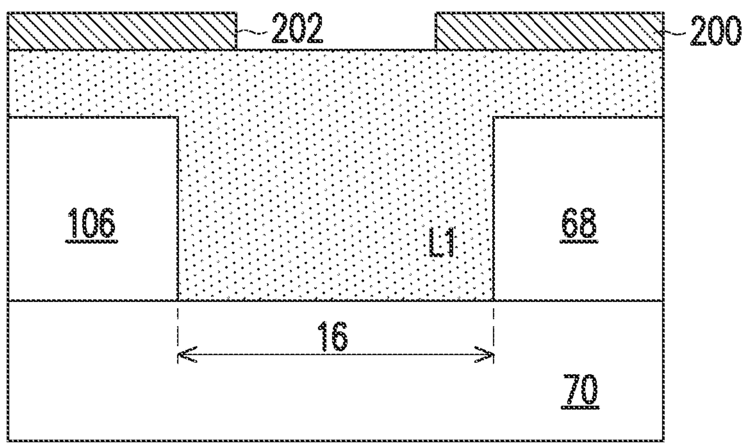
FIGS. 8A, 8B, 8C, and 8D illustrate processing steps for forming dielectric layers over the active dies and the dummy dies.
Figure 8B:
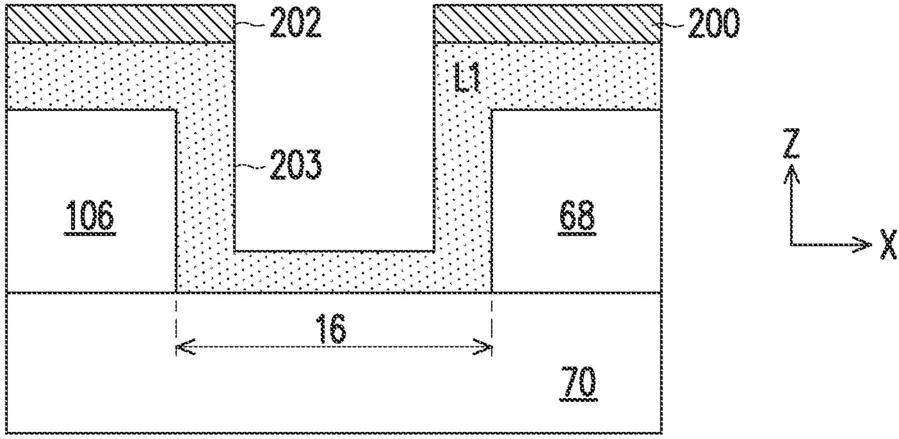
Figure 8C:
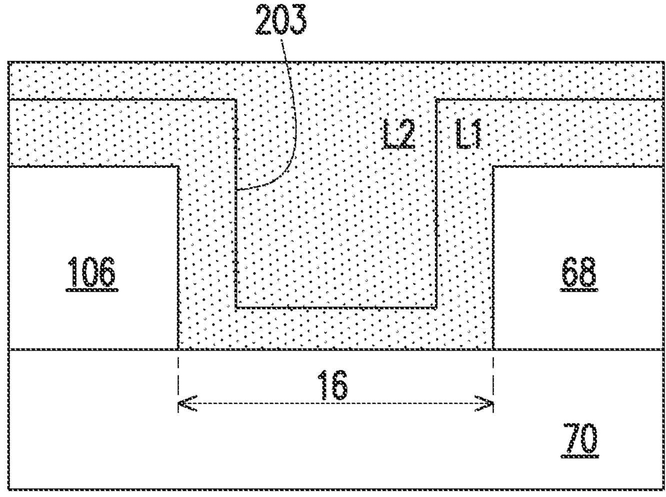
Figure 8D:
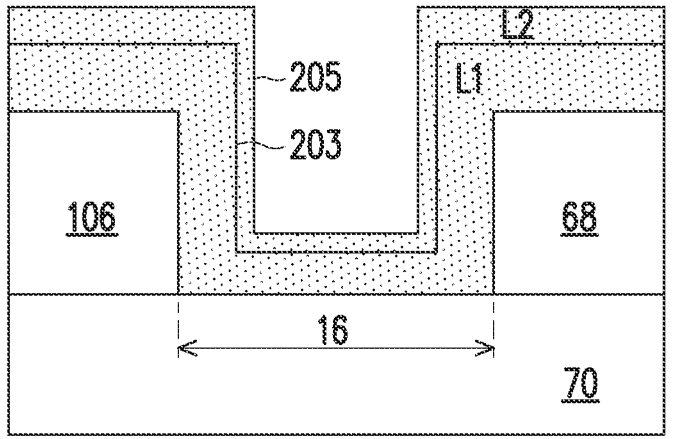
Figure 8D:
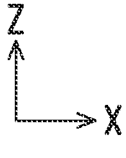

In a simulation exercise, when each layer L1, L2, L3, and L4 of silicon dioxide has a uniform compressive stress, as in FIG. 7A, of around −35 MPA (negative sign indicates compression), then wafer warpage is calculated to be around −460 μm. In the same exercise, if the thickness of the bottommost layer L1 of silicon dioxide (as in FIG. 7B) is increased such that the bottommost layer L1 exerts a compressive stress of around −75 MPa, and the thicknesses of the upper layers L2, L3, and L4 of silicon dioxide is maintained such that the compressive stress exerted remains at around −35 MPa, then the wafer warpage is decreased to around −548 μm. Thus, an improvement in the warpage is obtained The layers L1, L2, L3, and L4 of silicon dioxide are formed by sequentially depositing and patterning individual silicon dioxide layers in the gaps between the dies 68 and the dummy dies 106 to form a gap-fill structure. FIGS. 8A-8D illustrate one of many processes that can be used to form the gap-fill structure. In embodiments, the conformal depositions are repeated and polishing (CMP) is performed. It is also possible to change (e.g., gradually or at desired intervals) the deposition conditions in a CVD process when forming the layers L1, L2, L3, and L4 of silicon dioxide. As one example of a process for forming the gap-fill structure, as illustrated in FIG. 8A, a first layer L1 of silicon dioxide is formed over the dies 68 and the dummy dies 106 and in the gap 16. In embodiments, the first layer L1 is formed by CVD, PVD, sputtering, or other processes. Then, a first pattern (e.g., an opening) is formed over the first layer L1. In various embodiments, the first pattern is a photoresist pattern formed using photolithography. For example, as illustrated in FIG. 8A, a photoresist layer 200 is formed on the first layer L1 and exposed to light through a photomask having an appropriate pattern. The photoresist is then developed to remove an appropriate portion of the photoresist layer 200 to form the first pattern 202 over the first layer L1. In various embodiments, the photoresist is a positive resist or a negative resist, and the pattern of the photomask is chosen appropriately. A portion of the first layer L1 exposed through the first pattern 202 is removed to form an opening 203 in the first layer L1, as shown in FIG. 8B. The removal of the first portion of the first layer L1, in various embodiments, is performed by etching (e.g., anisotropic dry etch process) the first layer L1. The etching is controlled such that the first layer L1 (or portions thereof) in the opening 16 and on the sides of the die 68 and the dummy die 106 is retained, the first layer L1 (or portions thereof) in the opening 16 on the top surface of the substrate 70 is retained, and the first layer L1 (or portions thereof) on top surface of the die 68 and the dummy die 106 is retained. The photoresist layer 200 is removed using a suitable removal process such as, ashing or stripping processes. As illustrated in FIG. 8C, a second layer L1 of silicon dioxide is formed on the first layer L1. In embodiments, the second layer L2 is formed by CVD, PVD, sputtering, or other processes. An etching process similar to one discussed with reference to first layer L1 is performed to form an opening 205 in the second layer L2, as illustrated in FIG. 8D. The etching of layer L2 is controlled such that the layer L2 (or portions thereof) remaining on sidewalls of the opening 203, the layer L2 (or portions thereof) remaining the top surface of the layer L1 in the bottom of the opening 205, and the layer L2 (or portions thereof) remaining on the top (Z-direction) surface of the layer L1 over the dies 68 and 106 is relatively thinner than the layer L1. The processing is repeated until a desired number of layers of silicon dioxide are formed in the opening. Each layer of silicon dioxide other than the bottommost layer L1 has a same thickness as the other layers. In some embodiments, after formation of each layer, a CMP operation is performed to level the top upper surfaces of the silicon dioxide layers. In some embodiments, a curing step is performed to cure the layers of silicon dioxide, wherein the curing may be a thermal curing, a Ultra-Violet (UV) curing, or the like. In some embodiments, the dies 68 and/or the dummy dies 106 are buried in the layers of silicon dioxide, and after the curing of the layers of silicon dioxide, a planarization step, such as a grinding, may be performed to remove excess portions of the layers of silicon dioxide, which excess portions are over top surfaces of dies 68 and/or dummy dies 106.

In some embodiments, the refractive index (RI) of the bottommost layer L1 of silicon dioxide is greater than a sum of the refractive indices (RIs) of the layers L2, L3, and L4 of silicon dioxide. The refractive indices (RI) of the bottommost layer L1 of silicon dioxide and a sum of the refractive indices (RIs) of the layers L2, L3, and L4 of silicon dioxide is greater than 1.45.

In some embodiments, the oxide to silicon ratio in the bottommost layer L1 of silicon dioxide is around 1.7-2.3. In some embodiments, the sum of the oxide to silicon ratios of the upper layers L2, L3, and L4 of silicon dioxide is around 1.7-2.3. In some embodiments, the oxide to silicon ratio in the bottommost layer L1 of silicon dioxide is less than the sum of the oxide to silicon ratios in the upper layers L2, L3, and L4 of silicon dioxide.

The deposition processes for depositing the layers L1, L2, L3, and L4 include chemical vapor deposition (CVD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), or combinations thereof.

After the layers L1, L2, L3, and L4 of silicon dioxide have been deposited, a polishing operation, for example, chemical mechanical polishing (CMP) is performed on the layers L1, L2, L3, and L4 (or more layers) of silicon dioxide. In some embodiment, one or more of the layers L1, L2, L3, and L4 of silicon dioxide are polished to reduce a thickness of the one or more of the layers L1, L2, L3, and L4.

Although embodiments are discussed with reference to forming multiple layers L1, L2, L3, and L4 of silicon dioxide, it should be understood that this is an example and embodiments are not limited to forming layers of silicon dioxide. Any dielectric material or any other suitable material can be used in the opening 16 as long as the material limits crack formation and warpage, without departing from the scope of the disclosure. In some embodiments, one or more layers of silicon dioxide (e.g., the bottommost layer) contains nitrogen, carbon, fluorine, boron and/or phosphorous.

Figure 9:
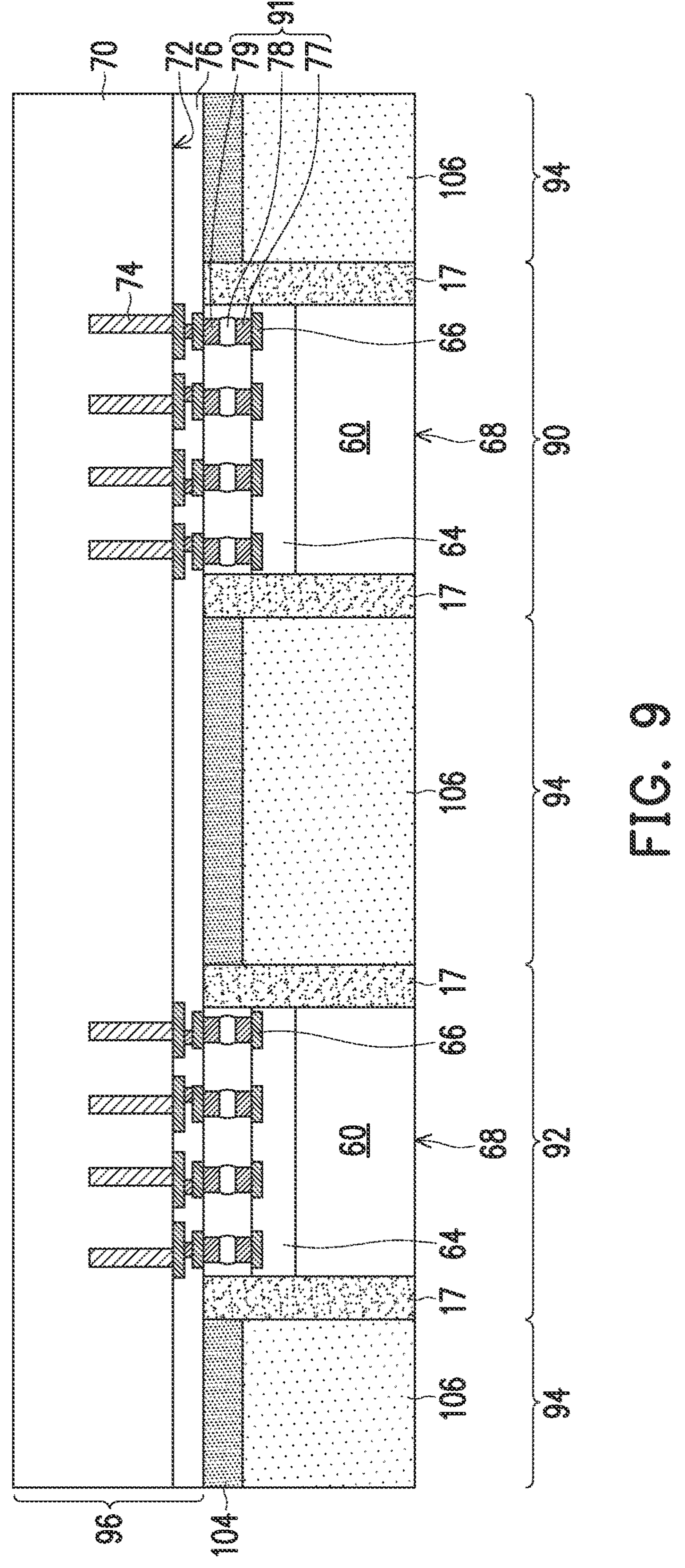
FIGS. 9, 10, 11, 12, and 13 are cross-sectional views of processes of forming an integrated structure.
Figure 10:
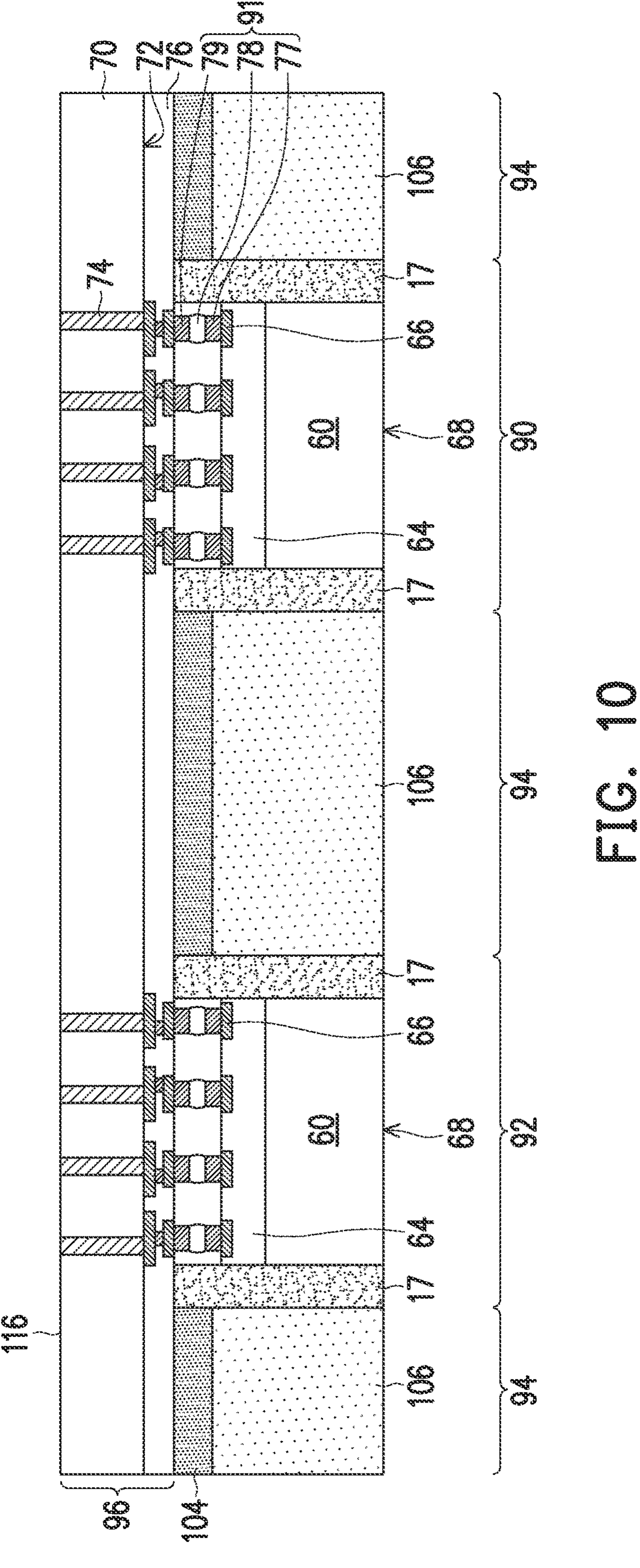

As shown in FIG. 9, the structure of FIG. 8 is flipped over to perform further processing. Although not shown, the structure may be placed on a carrier or support structure for further processing in subsequent steps. In FIG. 10, a thinning process is performed on the second side of the substrate 70 to thin the substrate 70 to a second surface 116 until TVs 74 are exposed. The thinning process may include an etching process, a grinding process, the like, or a combination thereof.

Figure 11:
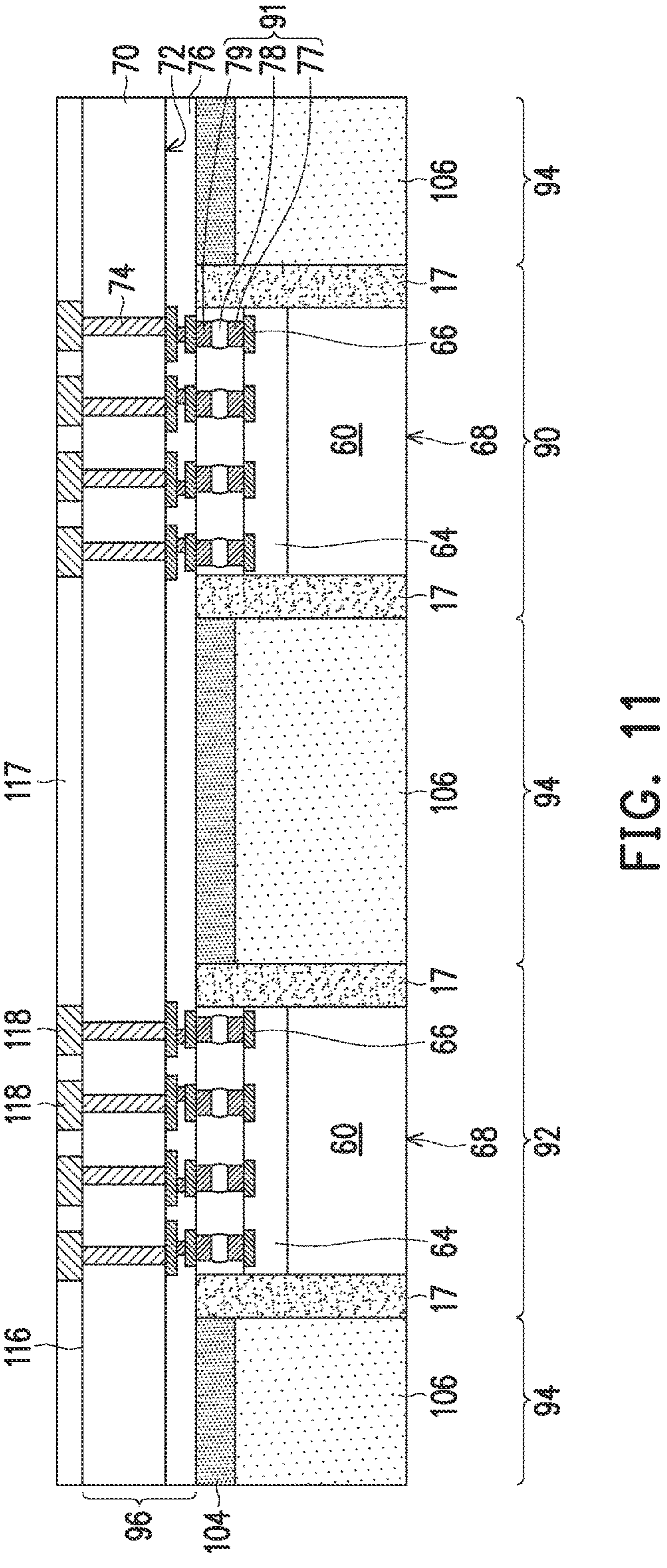

In FIG. 11, a redistribution structure is formed on the second surface 116 of the substrate 70, and is used to electrically connect the TVs 74 together and/or to external devices. The redistribution structure includes one or more dielectric layers 117 and metallization patterns 118 in the one or more dielectric layers 117. The metallization patterns may comprise vias and/or traces to interconnect TVs 74 together and/or to an external device. The metallization patterns 118 are sometimes referred to as Redistribution Lines (RDLs). The dielectric layers 117 may comprise silicon oxide, silicon nitride, silicon carbide, silicon oxynitride, low-K dielectric material, such as PSG, BPSG, FSG, SiOxCy, Spin-On-Glass, Spin-On-Polymers, silicon carbon material, compounds thereof, composites thereof, combinations thereof, or the like. The dielectric layers 117 may be deposited by any suitable method, such as spinning, CVD, PECVD, HDP-CVD, or the like. The metallization patterns 118 may be formed in the dielectric layer 117, for example, by using photolithography techniques to deposit and pattern a photoresist material on the dielectric layer 117 to expose portions of the dielectric layer 117 that are to become the metallization pattern 118. An etch process, such as an anisotropic dry etch process, may be used to create recesses and/or openings in the dielectric layer 117 corresponding to the exposed portions of the dielectric layer 117. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Figure 12:
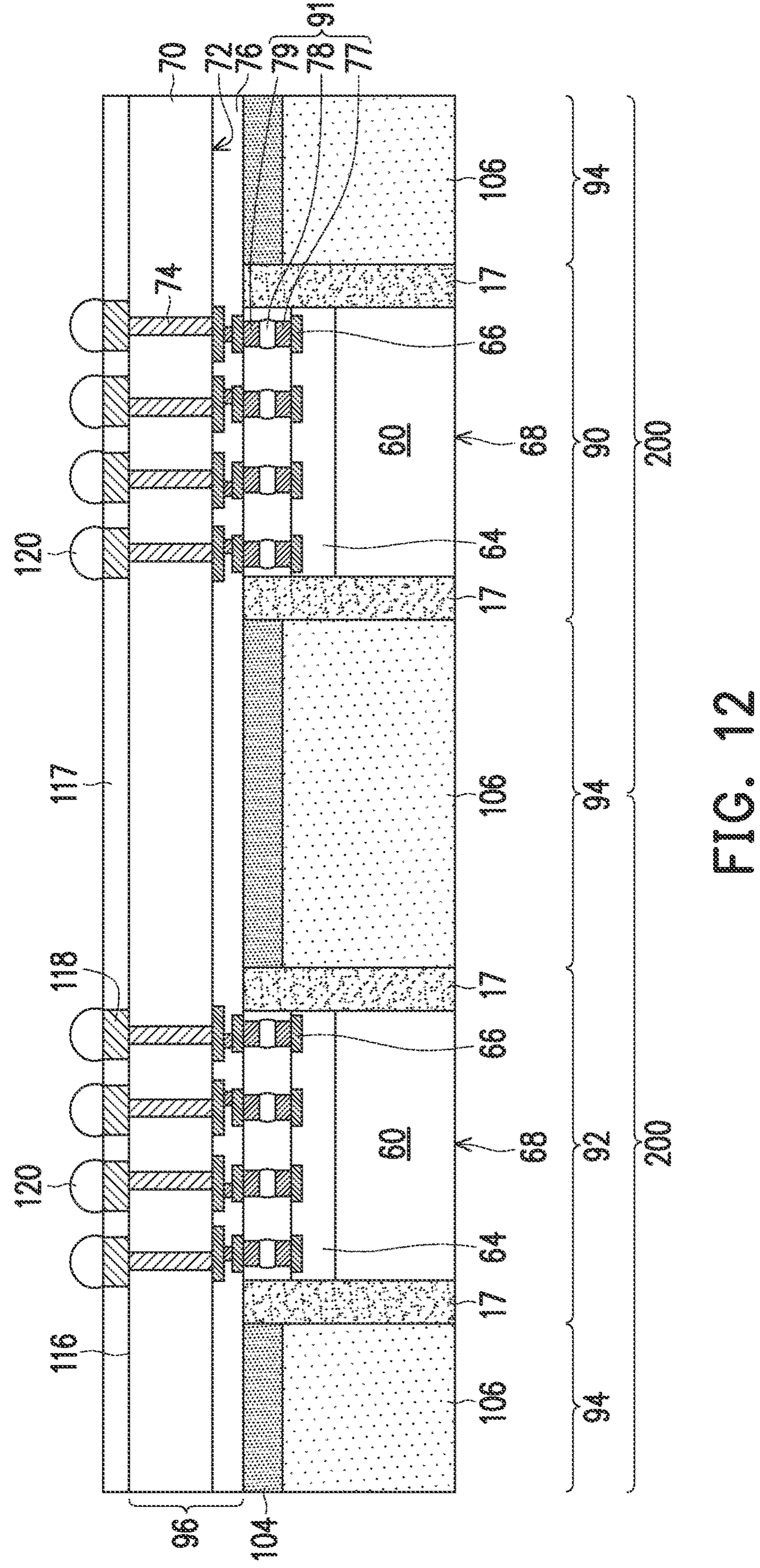

In FIG. 12, electrical connectors 120 are formed on the metallization patterns 118 and are electrically coupled to TVs 74. The electrical connectors 120 are formed at the top surface of the redistribution structure on the metallization patterns 118. In some embodiments, the metallization patterns 118 include under bump metallurgies (UBMs). In the illustrated embodiment, the pads are formed in openings of the dielectric layers 117 of the redistribution structure. In another embodiment, the pads (UBMs) can extend through an opening of a dielectric layer 117 of the redistribution structure and also extend across the top surface of the redistribution structure. In some embodiments, the electrical connectors 120 are solder balls and/or bumps, such as ball grid array (BGA) balls, C4 micro bumps, ENIG formed bumps, ENEPIG formed bumps, or the like. The electrical connectors 120 may include a conductive material such as solder, copper, aluminum, gold, nickel, silver, palladium, tin, the like, or a combination thereof. The electrical connectors 120 may be used to bond to an additional electrical component, which may be a semiconductor substrate, a package substrate, a Printed Circuit Board (PCB), or the like.

The components 96 and dummy dies 106 are singulated between adjacent regions 90 and 92 along scribe line regions 94 to form individual component packages 200 comprising, among other things, a die 68, a component 96, dies 88, cover structures 110, and portions 106 of the dummy dies 106. The singulation may be by sawing, dicing, or the like.

Figure 13:
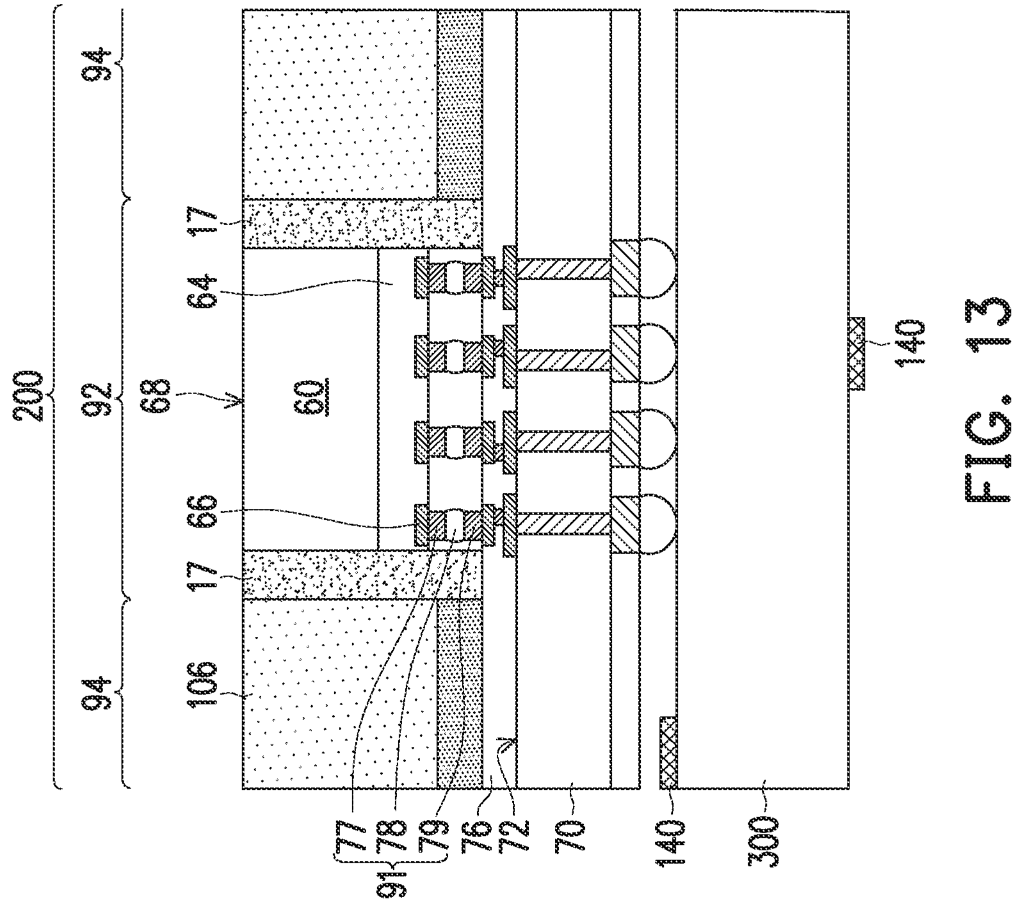

FIG. 13 illustrates the attachment of a component package 200 on a substrate 300. Electrical connectors 120 are aligned to, and are put against, bond pads of the substrate 300. The electrical connectors 120 may be reflowed to create a bond between the substrate 300 and the component 96. The substrate 300 may comprise a package substrate, such as a build-up substrate including a core therein, a laminate substrate including a plurality of laminated dielectric films, a PCB, or the like. The substrate 300 may comprise electrical connectors, such as solder balls, opposite the component package to allow the substrate 300 to be mounted to another device. An underfill material can be dispensed between the component package 200 and the substrate 300 and surrounding the electrical connectors 120. The underfill material may be any acceptable material, such as a polymer, epoxy, molding underfill, or the like.

Additionally, one or more surface devices 140 may be connected to the substrate 300. The surface devices 140 may be used to provide additional functionality or programming to the component package 200, or the package as a whole. In an embodiment, the surface devices 140 may include surface mount devices (SMDs) or integrated passive devices (IPDs) that include passive devices such as resistors, inductors, capacitors, jumpers, combinations of these, or the like that are desired to be connected to and utilized in conjunction with component package 200, or other parts of the package. The surface devices 140 may be placed on a first major surface of the substrate 300, an opposing major surface of the substrate 300, or both, according to various embodiments.

Figure 14:
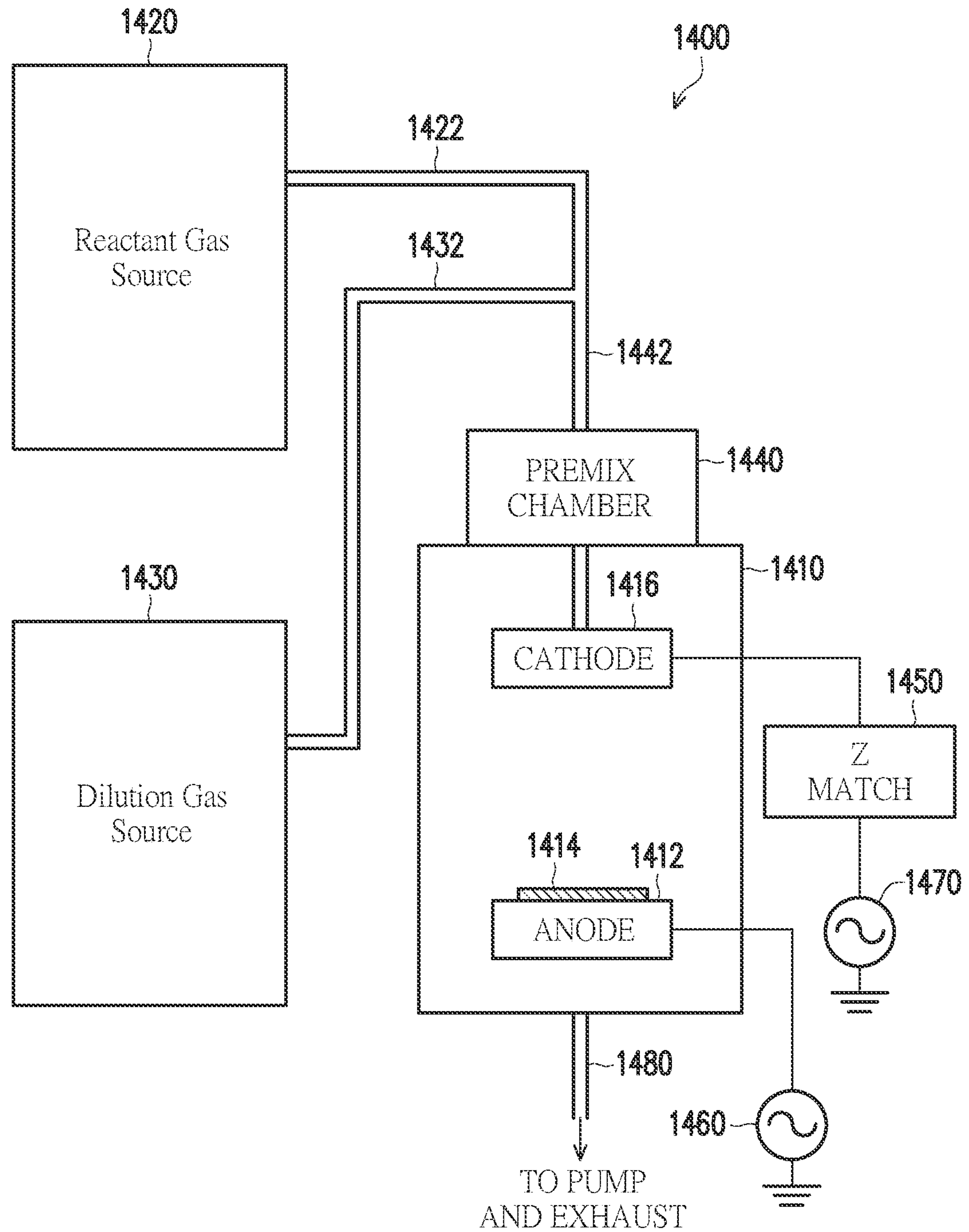
FIG. 14 illustrates a system including a CVD chamber which is used for depositing silicon dioxide layers, according to embodiments of the disclosure.

Referring now to FIG. 14, illustrated is a system 1400 including a CVD chamber which is used for depositing silicon dioxide layers L1, L2, L3, and L4 in accordance with embodiments of the present disclosure. System 1400 includes a reaction chamber 1410 (e.g., a CVD chamber) including a first electrode 1412 configured to support a substrate 1414 (e.g., substrates 60, 70 discussed above) and a second electrode 1416 disposed above the first electrode 1412 and the substrate 1414. System 1400 further includes at least one reactant gas source 1420 and at least one carrier gas source 1430, each operably coupled to reaction chamber 1410 for flowing at least one reactant gas and at least one carrier gas, respectively, into the reaction chamber 1410. System 1400 further includes an impedance matching unit 1450 coupled to the second electrode 1416 to apply a radio frequency (RF) power between the first and second electrodes 1412 and 1416. A tap setting may be applied to impedance matching unit 1450 to control the RF power applied between the first and second electrodes 1412 and 1416. During a deposition operation, a first tap setting may be applied to the impedance matching unit corresponding to a first maximum RF power, and during a termination operation or other operations, a second tap setting may be applied to the impedance matching unit corresponding to a second maximum RF power. A first RF power or voltage source 1460 is coupled to first electrode 1412, and a second RF power or voltage source 1470 is coupled to impedance matching unit 1450. A pump and exhaust feed line 1480 is connected to the chamber 1410 to provide pumping to establish partial vacuum conditions therein during CVD operation and to provide a gas exhaust line used to flush out the system after a wafer processing operation has been completed. In one example, process pressure for deposition and/or plasma treatment may be set between about 1 Torr and about 100 Torr. Chamber 1410 may also include heating elements to control the temperature within the chamber as desired. In one example, process temperature for deposition and/or plasma treatment may range between about 100 degrees Celsius and about 600 degrees Celsius.

In accordance with one aspect, first electrode 1412 is opposed to second electrode 1416 with a gap therebetween, and substrate 1414 is disposed between the first and second electrodes 1412 and 1416. According to another aspect, first electrode 1412 may function as an anode and be supplied with low frequency RF (LFRF) power from first RF power source 1460, and second electrode 1416 may function as a cathode and be supplied with high frequency RF (HFRF) power from second RF power source 1470. In one embodiment, second electrode 1416 may include a shower head electrode which is positioned operably adjacent the first electrode and configured to provide gaseous reactants into the chamber 1410 from gas supply sources (e.g., reactant gas source 1420, carrier gas source 1430). In other embodiments, gaseous reactants may enter the chamber 1410 through an inlet separate from the second electrode or through other means.

First electrode 1412 is configured for supporting at least one substrate, e.g., in the form of a semiconductor wafer or dielectric substrate. The first electrode 1412 is configured for holding or positioning (or otherwise securing) one or more substrates in a desired orientation so that chemical vapor deposition can take place. Accordingly, substrate can be supported, held, or otherwise positioned in orientations other than the shown horizontal position. Furthermore, although chamber 1410 is shown with two electrodes, it is to be understood that reaction chambers and methods can find use in systems which are not necessarily limited to only two electrodes. Furthermore, a single substrate is shown to be processed, but in other embodiments, a reaction chamber may be configured to process more than one substrate.

In accordance with one aspect, substrate 1414 (e.g., substrates 60, 70 discussed above) may include various semiconductor devices, and/or other suitable active and/or passive devices, at different stages of fabrication. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. A substrate having a device (e.g., integrated circuit) formed by other semiconductor fabrication technologies is also within the scope of the described method.

In one embodiment, substrate 1414 may include a semiconductor substrate, and may be comprised of silicon, or alternatively may include silicon germanium, gallium arsenic, or other suitable semiconductor materials. The semiconductor substrate may include underlying layers, devices, junctions, and other features (not shown) formed during prior process steps or which may be formed during subsequent process steps.

In accordance with one aspect, reactant gas source 1420 and carrier gas source 1430 may each include reservoirs and are coupled to a premix chamber 1440 via feed lines 1422, 1432, and common gas feed line 1442. At least one reactant gas and at least one carrier gas from reactant gas source 1420 and dilution gas source 1430, respectively, may be provided to premix chamber 1440 for premixing into a substantially uniform gas mixture prior to flow into reaction chamber 1410. In one example, premix chamber 1440 is disposed directly adjacent to chamber 1410.

Reactant gas source 1420 may include a bubbler chamber, a heater coil, a shut-off valve, and/or an output port. In one example, reactant gas source 1420 may provide various reactant gases depending on the desired layer to be deposited, for example a dielectric layer. In one example, reactant gases may include silicon-containing materials, nitrogen-containing materials, organic materials, metal-containing materials, halogen gas, combinations thereof, and the like. Although a single reactant gas source 1420 is illustrated, system 1400 may include a plurality of reactant gas sources as desired and coupled in a similar manner as reactant gas source 1420 to reaction chamber 1410.

Dilution gas source 1430 may include a heater coil, a shut-off valve, and/or an output port and may provide various dilution gases, including but not limited to inert gases, helium, argon, combinations thereof, and the like.

The reactant gas and dilution gas may be flowed from reactant gas source 1420 and dilution gas source 1430 to deposition chamber 1410 through various apparatus such as flow lines, pressure regulators, valves, mass flow controllers or other flow controllers, manifolds, and/or regulators. In one example, mass flow controllers may be of the electronic type wherein a variable set point may be established to provide a constant chosen gas flow rate and to automatically compensate for external parameter variations, such as variations in temperature and variations in pressures in the various flow lines of the system. The manifolds may be used to provide premixing of the various combined gases.

Both of the feed lines 1422 and 1432 may be provided with shut-off valves which may be used at any time to both start up and shut down the system operation. Shut-off valves may also be included in reactant gas source 1420 and/or dilution gas source 1430.

System 1400 may further include a purge gas source that is operably coupled to chamber 1410 for flowing a purge gas into chamber 1410 prior to deposition start up and may also be used to flush the system. The purge gas source may provide various purge gases, including but not limited to nitrogen or argon.

The substrate 1414 may be a silicon wafer or a dielectric substrate supported on an upper surface of the anode electrode. The wafer may be processed for depositing the layers L1, L2, L#, and L4 of silicon dioxide according to embodiments disclosed herein.

In one embodiment, the power ratios received from the low frequency RF source 1460 and the high frequency RF source 1470 may be varied in order to vary the stress of the deposited dielectric layer from a highly tensile state to a highly compressive state. In one example, the high frequency RF source 1470 may be operated at 13.56 megahertz and the low frequency RF source 1460 may be operated between 10-400 kilohertz. As an example, the total RF power applied to the CVD chamber may range between about 0 watts and about 200 watts. Although two RF power sources 1460 and 1470 are illustrated, a single RF power source may be used to apply RF power to each electrode 1412 and 1416 in another embodiment.

The high frequency RF source 1470 is connected as shown through an impedance matching unit 1450 for impedance matching purposes, which may substantially prevent high frequency RF power from being reflected back into the RF source 1470 and to maximize the amount of RF power absorbed by the plasma. Impedance matching unit 1450 includes various capacitive and inductive components which are configured for impedance matching and for maximizing power applied between the first and second electrodes 1412, 1416 of reaction chamber 1410.

Tap settings may be applied to the impedance matching unit coupled to the second electrode to apply a maximum radio frequency (RF) power between the first and second electrodes. Tap settings corresponding to applied maximum RF power may depend on various process parameters.

RF sources 1460 and 1470 are configured to provide RF power to the electrodes which is effective to both develop a plasma processing environment within the processing chamber and to provide a desired bias relative to the substrate. For example, a power differential between the electrodes may facilitate acceleration of ions or ionic species toward the subject substrate which may enhance conformal coverage and/or provide greater uniformity in film or layer composition.

Figure 15:
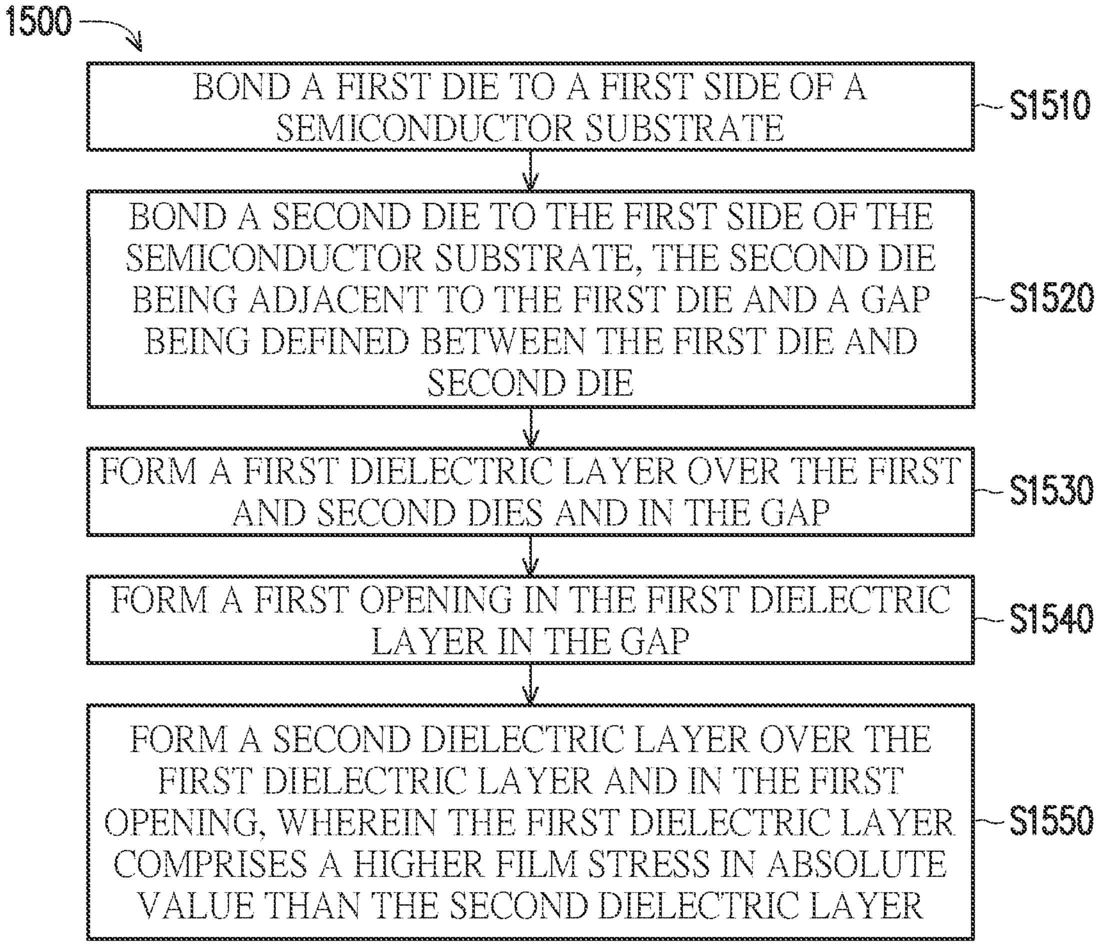
FIG. 15 is a flowchart of a method of forming an integrated circuit structure, according to embodiments of the disclosure.

An embodiment of the present disclosure is a method 1500 of forming an integrated circuit structure according to the flowchart illustrated in FIG. 15. It is understood that additional operations can be provided before, during, and after processes discussed in FIG. 15, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1510 of bonding a first die to a first side of a semiconductor substrate. Operation S1520 includes bonding a second die to the first side of the semiconductor substrate. The second die is adjacent to the first die and a gap is defined between the first die and second die. Operation S1530 includes forming a first dielectric layer over the first and second dies and in the gap. Operation S1540 includes forming a first opening in the first dielectric layer in the gap. Operation S1550 includes forming a second dielectric layer over the first dielectric layer and in the first opening. The first dielectric layer comprises a higher film stress in absolute value than the second dielectric layer.

Figure 16:
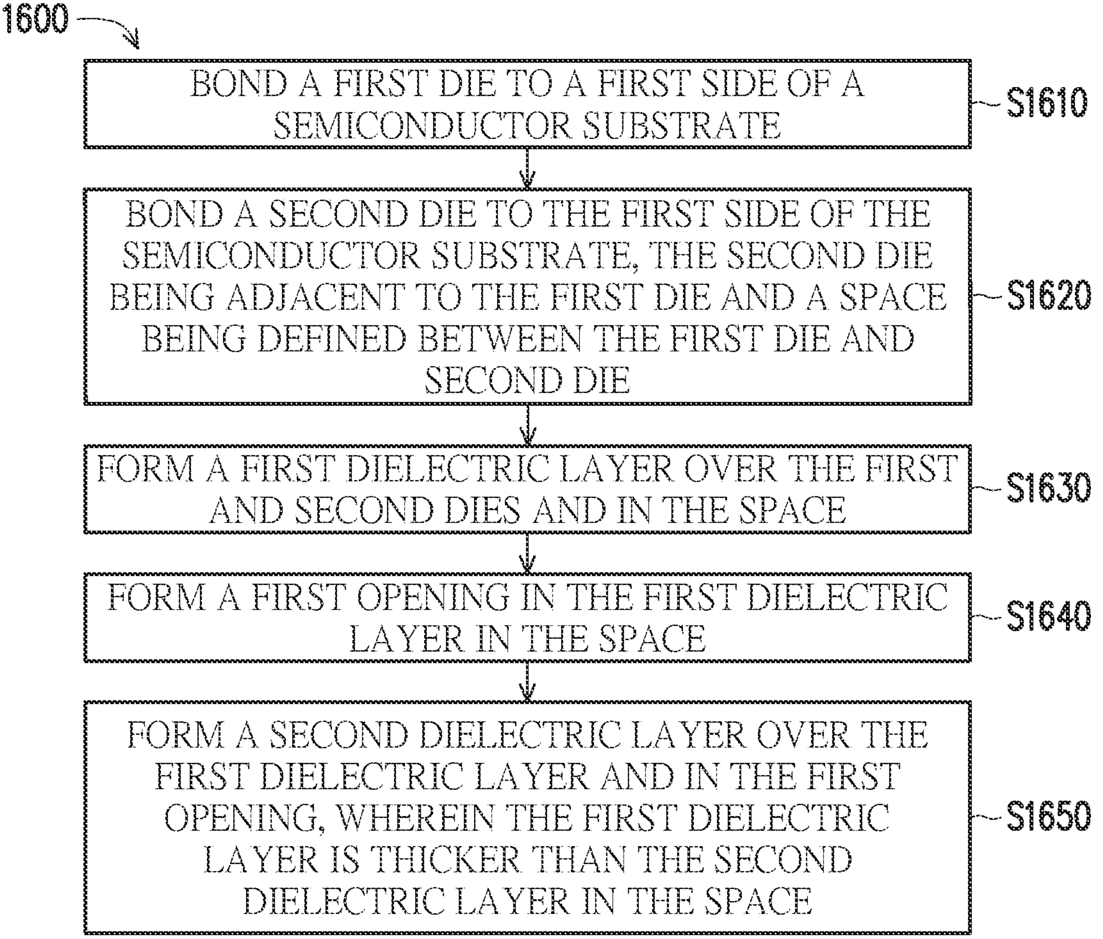
FIG. 16 is a flowchart of a method of forming an integrated circuit structure, according to embodiments of the disclosure.

Another embodiment of the present disclosure is a method 1600 of manufacturing a semiconductor device according to the flowchart illustrated in FIG. 16. It is understood that additional operations can be provided before, during, and after processes discussed in FIG. 16, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1610 bonding a first die to a first side of a semiconductor substrate. Operation S1620 includes bonding a second die to the first side of the semiconductor substrate. The second die is adjacent to the first die and a space is defined between the first die and second die. Operation S1630 includes forming a first dielectric layer over the first and second dies and in the space. Operation S1640 includes forming a first opening in the first dielectric layer in the space. Operation S1650 includes forming a second dielectric layer over the first dielectric layer and in the first opening. The first dielectric layer is thicker than the second dielectric layer in the space.

Embodiments of the disclosure provide advantageously reduce cracks in the silicon dioxide in the spacings between adjacent top dies and reduce warpage. As a result, fabrication errors are reduced. It will be understood that not all advantages have been necessarily discussed herein, no particular advantage is required for all embodiments or examples, and other embodiments or examples may offer different advantages.

An embodiment of the disclosure is a method of forming an integrated circuit structure. The method includes bonding a first die to a first side of a semiconductor substrate. A second die is bonded to the first side of the semiconductor substrate. The second die is adjacent to the first die and a gap is defined between the first die and second die. A first dielectric layer is formed over the first and second dies and in the gap. A first opening is formed in the first dielectric layer in the gap. A second dielectric layer is formed over the first dielectric layer and in the first opening. The first dielectric layer includes a higher film stress in absolute value than the second dielectric layer. In some embodiments, a second opening is formed in the second dielectric layer over the first opening. A third dielectric layer is formed over the second dielectric layer and in the second opening. A third opening is formed in the third dielectric layer over the second opening. A fourth dielectric layer is formed over the third dielectric layer and in the third opening. A fourth opening is formed in the fourth dielectric layer over the third opening. The first dielectric layer includes a higher film stress in absolute value than the second, third, and fourth dielectric layers. In some embodiments, the first dielectric layer is made of a same material as the second, third, and fourth dielectric layers. In some embodiments, the first dielectric layer thicker than each of the second, third, and fourth dielectric layers. In some embodiments, the first dielectric layer has a higher refractive index than the second, third, and fourth dielectric layers. In some embodiments, refractive indices of the first dielectric layer and a sum of the refractive indices of the second, third, and fourth dielectric layers is greater than 1.45. In some embodiments, the first, second, third, and fourth dielectric layers include silicon dioxide. In some embodiments, a oxide to silicon ratio in the first dielectric layer is less than a sum of oxide to silicon ratios in the second, third, and fourth dielectric layers. In some embodiments, the oxide to silicon ratio in the second, third, and fourth dielectric layers is between 1.7 to 2.3. In some embodiments, the oxide to silicon ratio in the first dielectric layer is between 1.7 to 2.3. In some embodiments, a ratio of a thickness of the first dielectric layer to a thickness of the first or second dies is between 0.01 to 0.4. In some embodiments, a sum of a thickness of the first dielectric layer and a thickness of the first or second die is 15 μm or higher. In some embodiments, the first die is an active die and the second die is a dummy die. In some embodiments, the first, second, third, and/or fourth dielectric layers are deposited by chemical vapor deposition (CVD).

Another embodiment of the disclosure is a method of forming an integrated circuit structure. The method includes bonding a first die to a first side of a semiconductor substrate. A second die is bonded to the first side of the semiconductor substrate. The second die is adjacent to the first die and a space is defined between the first die and second die. A first dielectric layer is formed over the first and second dies and in the space. A first opening is formed in the first dielectric layer in the space. A second dielectric layer is formed over the first dielectric layer and in the first opening. The first dielectric layer is thicker than the second dielectric layer in the space. In some embodiments, a second opening is formed in the second dielectric layer over the first opening. A third dielectric layer is formed over the second dielectric layer and in the second opening. A third opening is formed in the third dielectric layer over the second opening. A fourth dielectric layer is formed over the third dielectric layer and in the third opening. A fourth opening is formed in the fourth dielectric layer over the third opening. The first dielectric layer is thicker than the second, third, and fourth dielectric layers in the space. In some embodiments, the first, second, third, and fourth dielectric layers each include silicon dioxide. In some embodiments, an oxide to silicon ratio in the first dielectric layer is less than a sum of oxide to silicon ratios in the second, third, and fourth dielectric layers. In some embodiments, the first die is an active die and the second die is a dummy die.

Still other embodiment of the disclosure is an integrated circuit structure includes a first die bonded to a first side of a first substrate and a dummy die bonded to the first side of the first substrate. A space is being defined between the first die and the dummy die. The structure further includes a plurality of dielectric layers filling the space. A bottommost dielectric layer has a higher density than each of the other dielectric layers in the space. In some embodiments, each layer of the plurality of layers includes silicon dioxide. In some embodiments, the bottommost dielectric layer has a higher film stress in absolute value than each of the other dielectric layers in the space.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit structure, the method comprising:
bonding a first die to a first side of a semiconductor substrate;
bonding a second die to the first side of the semiconductor substrate, the second die being adjacent to the first die and a gap being defined between the first die and second die;
forming a first dielectric layer over the first and second dies and in the gap;
forming a first opening in the first dielectric layer in the gap; and
forming a second dielectric layer over the first dielectric layer and in the first opening, wherein the first dielectric layer comprises a higher film stress in absolute value than the second dielectric layer.

2. The method of claim 1, further comprising:
forming a second opening in the second dielectric layer over the first opening;
forming a third dielectric layer over the second dielectric layer and in the second opening;
forming a third opening in the third dielectric layer over the second opening;
forming a fourth dielectric layer over the third dielectric layer and in the third opening; and
forming a fourth opening in the fourth dielectric layer over the third opening, wherein the first dielectric layer comprises a higher film stress in absolute value than the second, third, and fourth dielectric layers.

3. The method of claim 2, wherein the first dielectric layer is made of a same material as the second, third, and fourth dielectric layers.

4. The method of claim 2, wherein the first dielectric layer is thicker than each of the second, third, and fourth dielectric layers.

5. The method of claim 2, wherein the first dielectric layer has a higher refractive index than the second, third, and fourth dielectric layers.

6. The method of claim 5, wherein refractive indices of the first dielectric layer and a sum of the refractive indices of the second, third, and fourth dielectric layers is greater than 1.45.

7. The method of claim 2, wherein the first, second, third, and fourth dielectric layers include silicon dioxide.

8. The method of claim 7, wherein an oxide to silicon ratio in the first dielectric layer is less than a sum of oxide to silicon ratios in the second, third, and fourth dielectric layers.

9. The method of claim 8, wherein the oxide to silicon ratio in the second, third, and fourth dielectric layers is between 1.7 to 2.3.

10. The method of claim 9, wherein the oxide to silicon ratio in the first dielectric layer is between 1.7 to 2.3.

11. The method of claim 2, wherein the first, second, third, and/or fourth dielectric layers are deposited by chemical vapor deposition (CVD).

12. The method of claim 1, wherein a ratio of a thickness of the first dielectric layer to a thickness of the first or second dies is between 0.01 to 0.4.

13. The method of claim 1, wherein a sum of a thickness of the first dielectric layer and a thickness of the first or second die is 15 μm or higher.

14. The method of claim 1, wherein the first die is an active die and the second die is a dummy die.

15. A method of forming an integrated circuit structure, the method comprising:
bonding a first die to a first side of a semiconductor substrate;
bonding a second die to the first side of the semiconductor substrate, the second die being adjacent to the first die and a space being defined between the first die and second die;
forming a first dielectric layer over the first and second dies and in the space;
forming a first opening in the first dielectric layer in the space; and
forming a second dielectric layer over the first dielectric layer and in the first opening, wherein the first dielectric layer is thicker than the second dielectric layer in the space.

16. The method of claim 15, further comprising:
forming a second opening in the second dielectric layer over the first opening;
forming a third dielectric layer over the second dielectric layer and in the second opening;
forming a third opening in the third dielectric layer over the second opening;
forming a fourth dielectric layer over the third dielectric layer and in the third opening; and
forming a fourth opening in the fourth dielectric layer over the third opening, wherein the first dielectric layer is thicker than the second, third, and fourth dielectric layers in the space.

17. The method of claim 16, wherein an oxide to silicon ratio in the first dielectric layer is less than a sum of oxide to silicon ratios in the second, third, and fourth dielectric layers.

18. The method of claim 15, wherein the first die is an active die and the second die is a dummy die.

19. An integrated circuit structure, comprising:
a first die bonded to a first side of a first substrate;
a dummy die bonded to the first side of the first substrate, a space being defined between the first die and the dummy die; and
a plurality of dielectric layers filling the space, wherein each layer of the plurality of layers includes silicon dioxide and a bottommost dielectric layer has a higher density than each of other dielectric layers in the space.

20. The integrated circuit structure of claim 19, wherein the bottommost dielectric layer has a higher film stress in absolute value than each of the other dielectric layers in the space.

* * * * *